(12) United States Patent
Yang

(10) Patent No.: US 8,634,249 B2
(45) Date of Patent: Jan. 21, 2014

(54) PROGRAMMING METHOD FOR NON-VOLATILE MEMORY DEVICE

(75) Inventor: Seung-Jin Yang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 132 days.

(21) Appl. No.: 13/169,079

(22) Filed: Jun. 27, 2011

(65) Prior Publication Data

US 2012/0081969 A1  Apr. 5, 2012

(30) Foreign Application Priority Data

Sep. 30, 2010  (KR) ........................ 10-2010-0095371

(51) Int. Cl.
*G11C 16/04*  (2006.01)
(52) U.S. Cl.
USPC ............. 365/185.19; 365/185.16; 365/185.18
(58) Field of Classification Search
USPC .......................... 365/185.19, 185.18, 189.16
See application file for complete search history.

(56) References Cited

U.S. PATENT DOCUMENTS

| 5,903,493 | A * | 5/1999 | Lee ................................ 365/149 |
| 6,118,700 | A * | 9/2000 | Wohlrab et al. .......... 365/185.19 |
| 6,314,018 | B1 * | 11/2001 | Pochmuller .................... 365/149 |
| 6,829,170 | B2 * | 12/2004 | Mirabel et al. ........... 365/185.18 |
| 6,839,284 | B1 * | 1/2005 | Yang et al. ................ 365/185.29 |
| 7,342,824 | B2 * | 3/2008 | Hsu ................................ 365/158 |
| 7,697,317 | B2 * | 4/2010 | Shimaoka et al. ............ 365/148 |
| 7,911,824 | B2 * | 3/2011 | Kawai et al. .................. 365/148 |
| 7,978,521 | B2 * | 7/2011 | Son et al. ................. 365/185.19 |

FOREIGN PATENT DOCUMENTS

| JP | 09-307009 | 11/1997 |
| JP | 2001325793 | 11/2001 |
| KR | 1020100006712 A | 1/2010 |

* cited by examiner

*Primary Examiner* — Pho M Luu
(74) *Attorney, Agent, or Firm* — Volentine & Whitt, PLLC

(57) ABSTRACT

A method of programming a nonvolatile memory device comprises applying positive pulses and negative pulses simultaneously to a memory cell array to program at least one memory cell included in the memory cell array.

18 Claims, 12 Drawing Sheets

PROGRAMMING METHOD FOR NON-VOLATILE MEMORY DEVICE

CROSS-REFERENCE TO RELATED APPLICATIONS

This application claims priority under 35 U.S.C. §119 to Korean Patent Application No. 10-2010-0095371 filed on Sep. 30, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to programming methods for nonvolatile memory devices.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory devices include mask read-only memory (MROM), programmable read-only memory (PROM), erasable programmable read-only memory (EPROM), and electrically erasable programmable read-only memory (EEPROM).

Due to various technological trends, there has been an increasing demand for nonvolatile memory devices. Such trends include, for instance, the proliferation of mobile devices that must retain stored data even when powered down. In addition, there has been a continuing demand for nonvolatile memory devices having improved performance and storage capacity. In light of these developments, researchers continue to aggressively develop and improve on nonvolatile memory technologies.

SUMMARY OF THE INVENTION

According to one embodiment of the inventive concept, a programming method is provided for a nonvolatile memory device comprising a memory cell array in which at least one memory cell comprises a memory transistor connected to a selection line and a control gate connected to a wordline. The method comprises simultaneously applying a plurality of positive pulses to the selection line and a plurality of negative pulses to the wordline.

According to another embodiment of the inventive concept, a programming method is provided for a nonvolatile memory device comprising a memory cell array in which at least one memory cell comprises a memory transistor connected to a selection line and a control gate connected to a wordline. The method comprises (a) applying a first positive step pulse to the selection line and a first negative step pulse to the wordline such that a rising edge of the first positive step pulse overlaps a rising edge of the first negative step pulse, (b) verifying, using the first positive step pulse and the first negative step pulse, whether the at least one memory cell is successfully programmed, and (c) applying a second positive step pulse to the selection line while the first negative step pulse is applied to the word line.

According to still another embodiment of the inventive concept, a method is provided for programming a nonvolatile memory device comprising a two-transistor Fowler-Nordheim NOR memory cell array in which a selected memory cell comprises a memory transistor connected to a selection line, and a control gate connected to a wordline. The method comprises applying positive step pulses having gradually increasing pulse levels to the selection line and applying negative step pulses having gradually increasing pulse levels to the wordline to program the selected memory cell, wherein each of the positive step pulses overlaps in time with a corresponding one of the negative step pulses.

These and other embodiments of the inventive concept can decrease interference between adjacent memory cells, thereby increasing the reliability of nonvolatile memory devices.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

As used in this description, the term "and/or" indicates any and all combinations of one or more of the associated listed items. Unless specially defined, all terms (including technical and scientific terms) used in the description should be interpreted according to their ordinary meanings as understood by those of ordinary skill in the art. Moreover, the terms are not to be interpreted in an overly idealized manner unless specially so defined.

Figure 1:
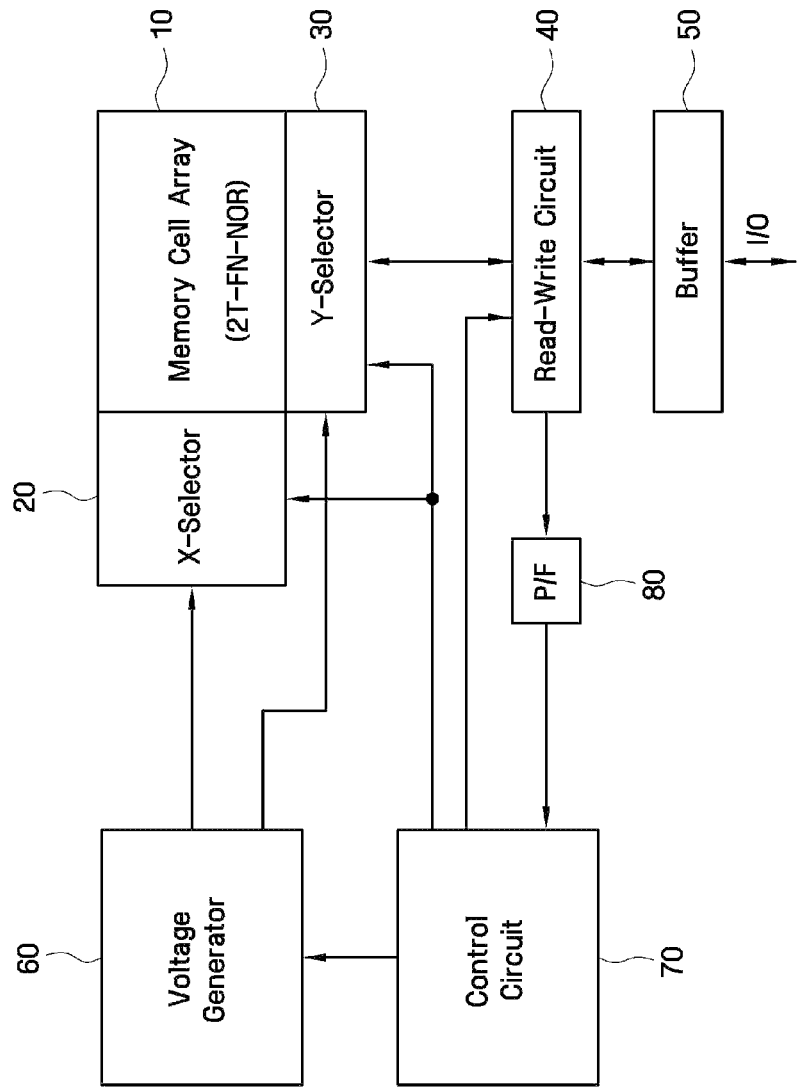
FIG. 1 is a block diagram of a nonvolatile memory device in accordance with an embodiment of the inventive concept.
Figure 2:
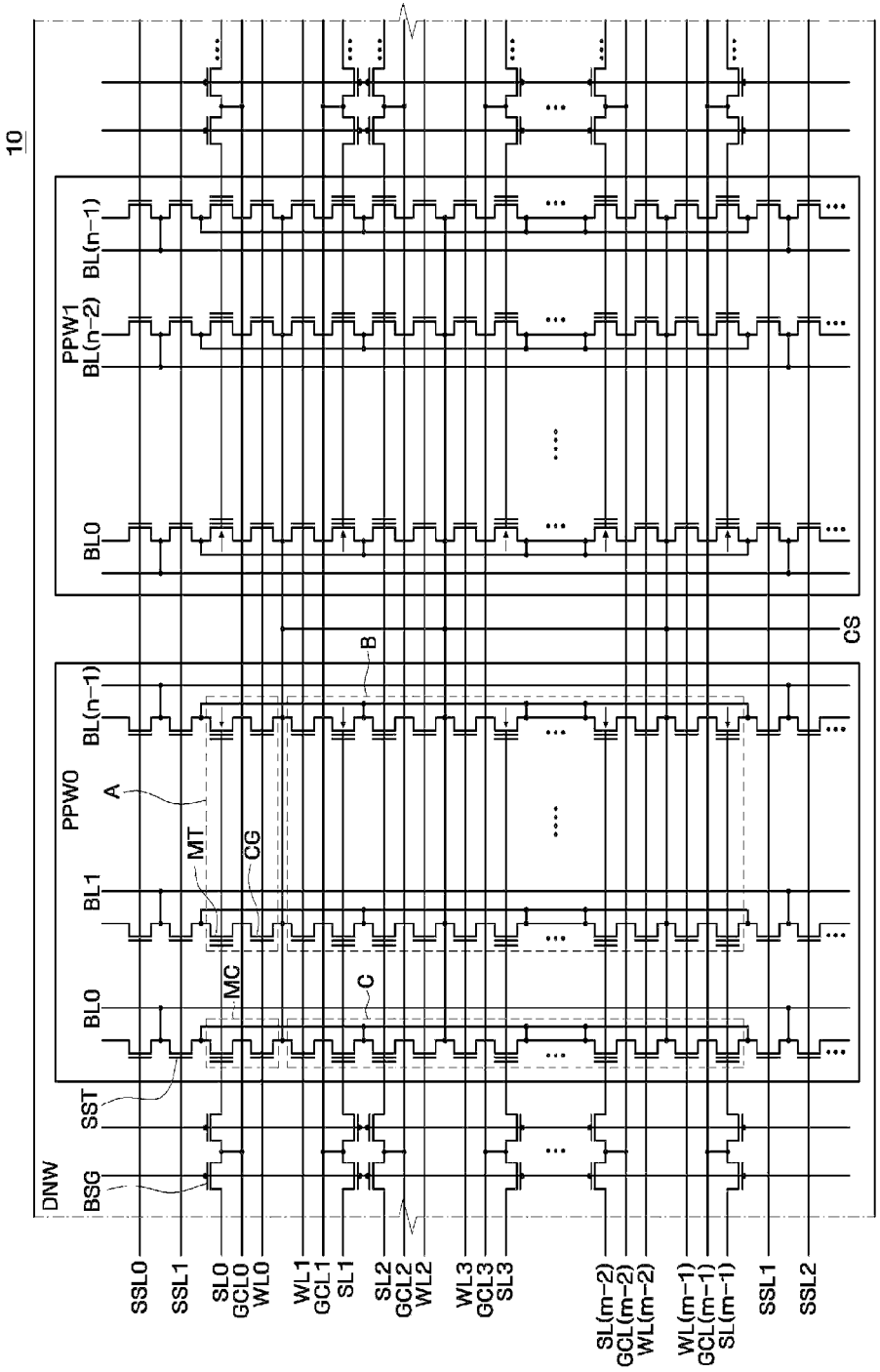
FIG. 2 is a circuit diagram of a memory cell array in accordance with an embodiment of the inventive concept.

FIG. 1 is a block diagram illustrating a nonvolatile memory device in accordance with an embodiment of the inventive concept, and FIG. 2 is a circuit diagram of a memory cell array in the nonvolatile memory device in accordance with an embodiment of the inventive concept.

In the description of FIGS. 1 and 2, it is assumed that memory cells are programmed by Fowler-Nordheim (FN) tunneling; however, the inventive concept is not limited thereto. In addition, a two-transistor (2T)-Fowler-Nordheim (FN)-NOR memory cell array is presented as an example of a memory cell array, but the inventive concept is not limited thereto. As alternative examples, the inventive concept could be embodied in other types of memory cell arrays such as NAND memory cell arrays.

Referring to FIG. 1, a nonvolatile memory device comprises a memory cell array 10 for storing R-bit data, where R is an integer greater than or equal to 1. Memory cell array 10 may be, for instance, a 2T-FN-NOR memory cell array. More specifically, memory cell array 10 may be a 2T-FN-NOR memory cell array comprising a plurality of memory cells arranged in a plurality of rows connected to corresponding wordlines, and a plurality of columns connected to corresponding bit lines.

Referring to FIG. 2, memory cell array 10 comprises a plurality of blocks corresponding to a plurality of pocket wells PPW0 and PPW1 arranged in a deep well DNW. Each of the blocks comprises a plurality of sectors each comprising a plurality of memory cells. Sector selection transistors SST are controlled by a voltage applied to sector selection lines SSL0, SSL1 and SSL2 to select a specific sector among the sectors formed in pocket wells PPW0 and PPW1 (or blocks). For example, sector selection transistors SST controlled by a voltage applied to second sector selection lines SSL1 may be used to select a sector having the memory cells connected between second sector selection lines SSL1 among the sectors formed in a first pocket well PPW0.

FIG. 2 shows only some sectors formed in each of pocket wells PPW0 and PPW1 (or blocks), and each block may comprise additional sectors that are not shown. Sector selection transistors SST are formed at opposite ends of each sector as shown in FIG. 2.

Each sector comprises a plurality of memory cells connected in series with sector selection transistors SST. The series-connected memory cells share bit lines BL0 through BL(n−1) via sector selection transistors SST. Accordingly, where sector selection transistors SST are turned on by a voltage applied to sector selection lines SSL1, a voltage applied to bit lines BL0 through BL(n−1) is applied to each of the memory cells via sector selection transistors SST.

Memory cells arranged in the same row of a block form a page row. For example, in FIG. 2, a memory cell MC and other memory cells arranged in the same row of a region A form one page row. The memory cells arranged in the same page row share a selection line SL0 and a wordline WL0 as shown in FIG. 2. Accordingly, a voltage applied to a global control line GCL0 is applied to the memory cells arranged in the same page row via selection line SL0 by turning on a byte selection gate BSG. In a similar manner, a voltage applied to the wordline WL0 is applied to the memory cells arranged in the same page row.

Each of the memory cells comprises a memory transistor MT and a control gate CG. Memory transistor MT is controlled by a voltage applied to a corresponding selection line SL and is configured to store electrical charges. Control gate CG is controlled by a voltage applied to the wordline WL and is connected in series to memory transistor MT. Each of the memory cells can be programmed by storing charges in memory transistor MT by FN tunneling, and can be erased by discharging the charges stored in memory transistor MT by FN tunneling.

A common source line CS is connected between control gates CG of two adjacent memory cells as shown in FIG. 2. The memory cells can share common source line CS.

Referring again to FIG. 1, a row selector (X-selector) 20 selects one of the memory blocks (or sectors) of memory cell array 10 under the control of a control circuit 70 and selects one of the rows (e.g., wordlines WL and global control lines GCL) of the selected memory block. Further, row selector 20 simultaneously supplies a plurality of positive pulses and a plurality of negative pulses generated by a voltage generator 60 to the selected row and non-selected rows of memory cell array 10, respectively, under the control of control circuit 70. A pulse level and application timing of the pulse applied to each row can be controlled by control circuit 70. Meanwhile, a column selector (Y-selector) 30 selects one of the columns (e.g., bit lines BL) of memory cell array 10 similarly to row selector 20.

A read-write circuit 40 is controlled by control circuit 70, and operates as a sense amplifier or a write driver according to different operation modes of the nonvolatile memory device. For example, in a verify-read operation, read-write circuit 40 operates as a sense amplifier for reading program data from memory cell array 10. On the other hand, in a program (write) operation, read-write circuit 40 operates as a write driver for driving columns of memory cell array 10 according to data to be stored in memory cell array 10.

A buffer 50 stores data provided from an external device (e.g., a memory controller or host system).

Voltage generator 60 generates a plurality of positive pulses and a plurality of negative pulses to be supplied to rows and columns of memory cell array 10 and well regions DNW and PPW in which the memory cells are formed according to different operation modes. A voltage generation operation of voltage generator 60 is controlled by control circuit 70.

Control circuit 70 directly or indirectly controls row selector 20, column selector 30, read-write circuit 40, and voltage generator 60 to control substantially all operations (e.g., program, read and erase operations) of the nonvolatile memory device. As examples, control circuit 70 performs control operations so that buffer 50 loads data to be programmed, and voltage generator 60 simultaneously applies a plurality of positive pulses and a plurality of negative pulses to memory cell array 10 to program and erase the memory cells.

A pass/fail verification circuit 80 performs a program verifying operation on the memory cells in successive iterations of the program operation under the control of control circuit 70. Verification results obtained by pass/fail verification circuit 80 are output to control circuit 70. Control circuit 70 determines whether further program pulses are to be applied to the memory cells based on the program verification results provided from pass/fail verification circuit 80. For example, where it is determined that the memory cells are successfully programmed (i.e., pass), no more program pulses are applied, and the program operation of the selected memory cells is completed. On the other hand, where it is determined that the memory cells are not successfully programmed (i.e., fail), further program pulses are applied within a predetermined number of times until all of the memory cells are successfully programmed.

Figure 3:
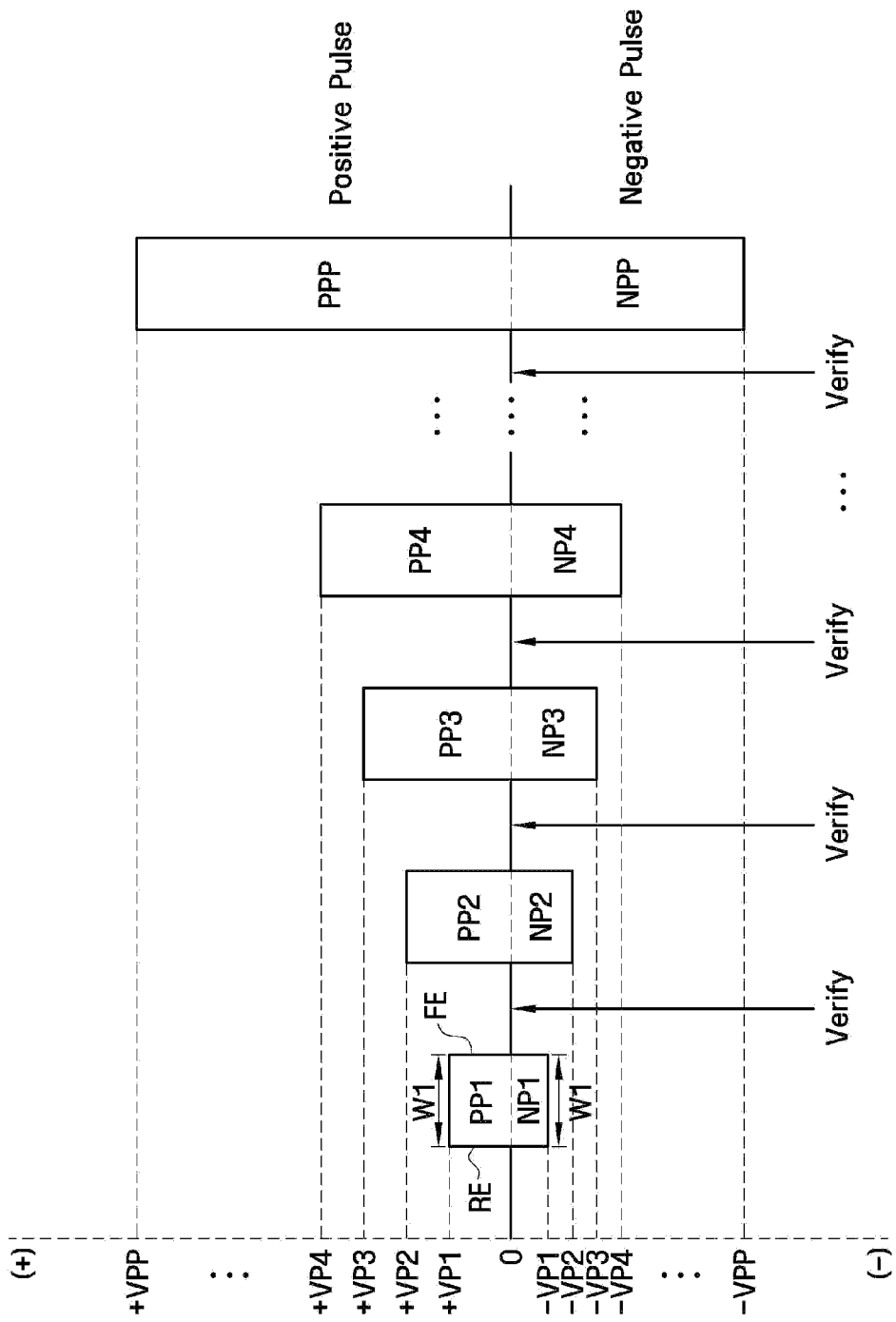
FIG. 3 is a diagram for explaining a programming method for a nonvolatile memory device in accordance with an embodiment of the inventive concept.

FIG. 3 is a diagram for explaining a programming method for a nonvolatile memory device in accordance with an embodiment of the inventive concept. For convenience of explanation, the method will be described with reference to memory cell MC shown in FIG. 2. However, the following description can also be applied to other memory cells in memory cell array 10.

In a program operation of memory cell MC, a plurality of positive pulses are applied to a selected global control line GCL0 and a selected selection line SL0, while a plurality of negative pulses are applied to a selected pocket well PPW0, selected and non-selected wordlines WL0 through WL(m−1), and a selected bit line BL0. A ground voltage GND is applied to non-selected global control lines GCL1 through GCL(m−

1), non-selected selection lines SL1 through SL(m−1), a non-selected pocket well PPW1, and non-selected bit lines BL1 through BL(n−1).

The plurality of positive pulses and negative pulses are simultaneously applied to memory cell array 10 with voltage levels shown in FIG. 3. The plurality of positive pulses and negative pulses can be applied to memory cell array 10 such that a rising edge RE of at least one of the positive pulses overlaps a rising edge RE of at least one of the negative pulses. In the example of FIG. 3, all rising edges of the positive pulses overlap all rising edges of the negative pulses. In other words, pulses are applied at substantially the same time point.

In the example of FIG. 3, the positive pulses include a plurality of positive step pulses PP1 through PPP having the same pulse width W1 and gradually and sequentially increasing pulse levels +VP1 through +VPP, and the negative pulses include a plurality of negative step pulses NP1 through NPP having the same pulse width W1 and gradually and sequentially increasing pulse levels −VP1 through −VPP.

As shown in FIG. 3, positive step pulses PP1 through PPP and negative step pulses NP1 through NPP are applied to memory cell array 10 in pairs, where each pair has overlapping rising edges RE and includes one of positive step pulses PP1 through PPP and one of negative step pulses NP1 through NPP. The same number of positive step pulses PP1 through PPP and negative step pulses NP1 through NPP can be applied to memory cell array 10 while memory cell MC is programmed. Furthermore, each of the pairs of positive step pulses PP1 through PPP and negative step pulses NP1 through NPP can have overlapping falling edges FE.

Verifying steps are performed between the respective pairs of positive step pulses PP1 through PPP and negative step pulses NP1 through NPP. The verifying steps are performed using respective positive step pulses PP1 through PPP and respective negative step pulses NP1 through NPP to verify whether memory cell MC is successfully programmed. Where pass/fail verification circuit 80 verifies that memory cell MC is successfully programmed after applying, for instance, a second positive step pulse PP2 and a second negative step pulse NP2, the program operation is completed without applying positive step pulses PP3 through PPP and negative step pulses NP3 through NPP. In addition, although not shown in FIG. 3, the verifying steps can be performed after a predetermined standby period of time after applying the respective pairs of the positive step pulses PP1 through PPP and negative step pulses NP1 through NPP.

Although FIG. 3 illustrates an example in which positive step pulses PP1 through PPP have gradually and sequentially increasing pulse levels +VP1 through +VPP and negative step pulses NP1 through NPP have gradually and sequentially increasing pulse levels −VP1 through −VPP, the inventive concept is not limited to these conditions. Rather, various modifications can be made to the example of FIG. 3, as will be apparent from various alternative embodiments described with reference to FIGS. 4 and 5.

Figure 4:
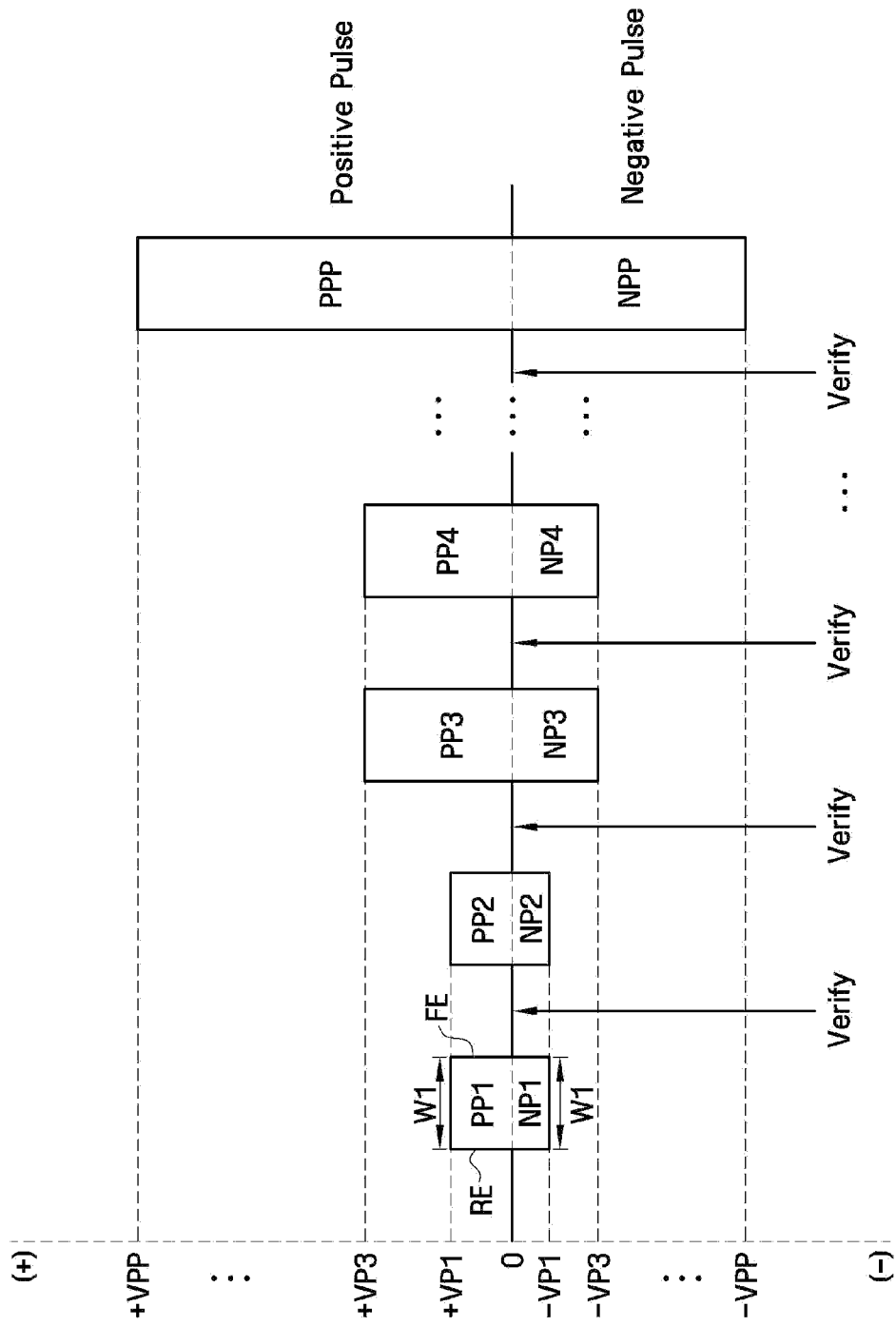
FIGS. 4 and 5 are diagrams for explaining variations of the method of FIG. 3 in accordance with embodiments of the inventive concept.
Figure 5:
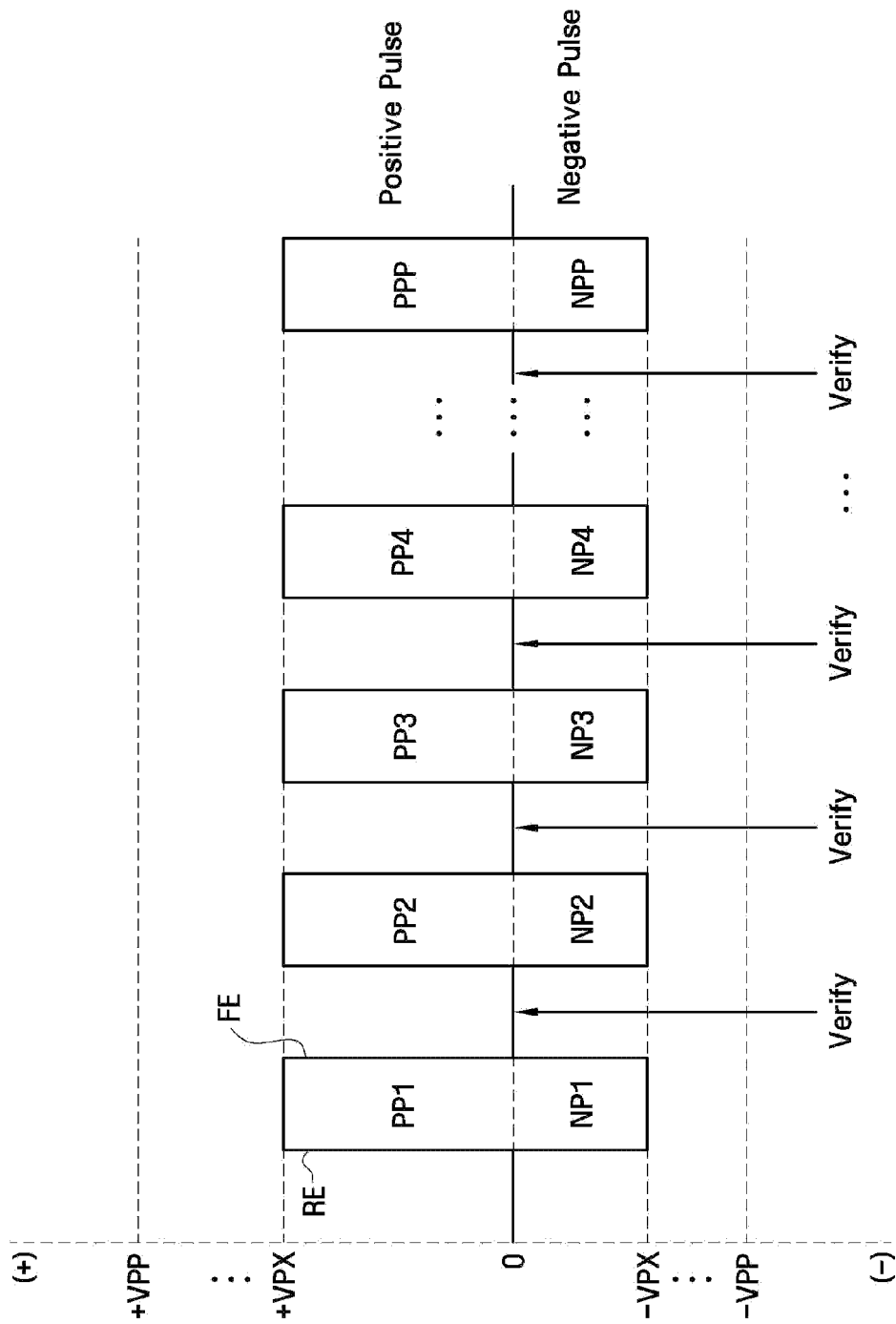

FIGS. 4 and 5 are diagrams for explaining variations of the programming method of FIG. 3 in accordance with embodiments of the inventive concept. In the descriptions of FIGS. 4 and 5, features that have already been described with respect to FIG. 3 will not be described again in order to avoid redundancy.

In the variation of FIG. 4, positive step pulses PP1 through PPP have increasing pulse levels +VP1 through +VPP, and negative step pulses NP1 through NPP have gradually increasing pulse levels −VP1 through −VPP. However, the pulse levels do not increase with each successive pulse. Rather, two pluses having the same level are applied, followed by two pulses having a higher pulse level than that of the previous two pulses. In other embodiments, more than two pulses of the same level can be applied successively.

In the variation of FIG. 5, positive step pulses PP1 through PPP have the same pulse level +VPX (X≤P) and negative step pulses NP1 through NPP have the same pulse level −VPX (X≤P). The pulse levels +VPX and −VPX can be modified where necessary.

Figure 6:
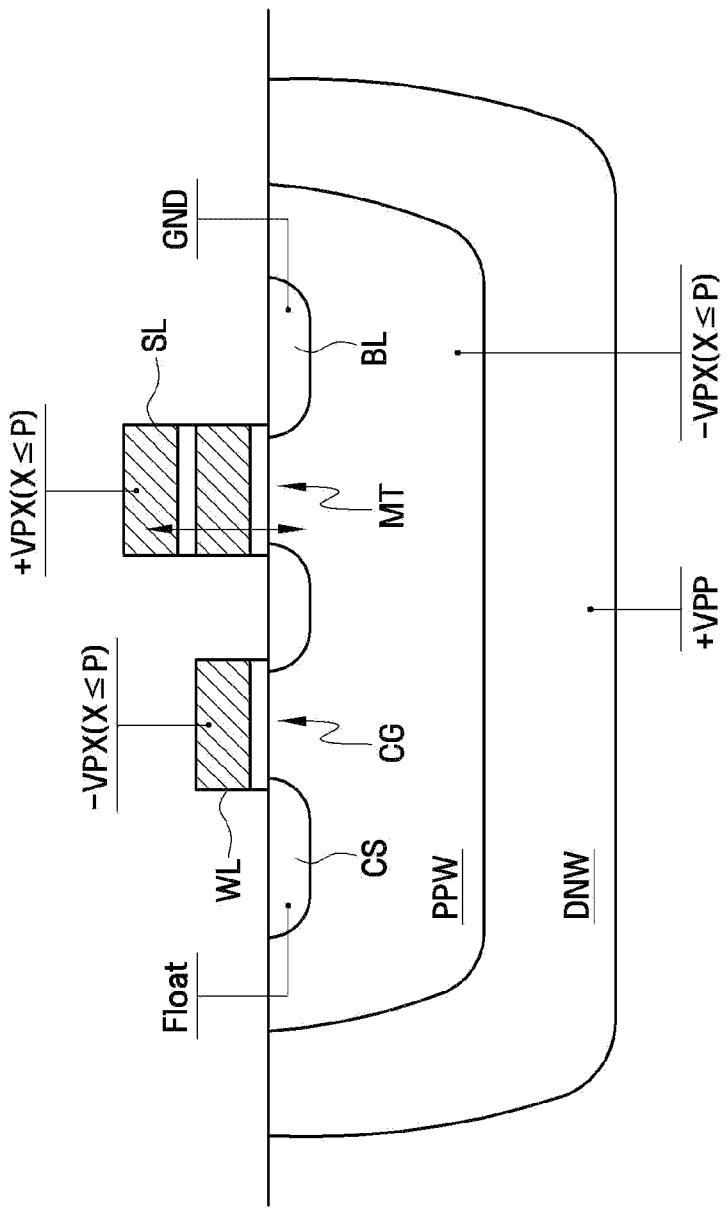
FIGS. 6 through 8 are diagrams for explaining the effects of programming methods of FIGS. 3 through 5.
Figure 7:
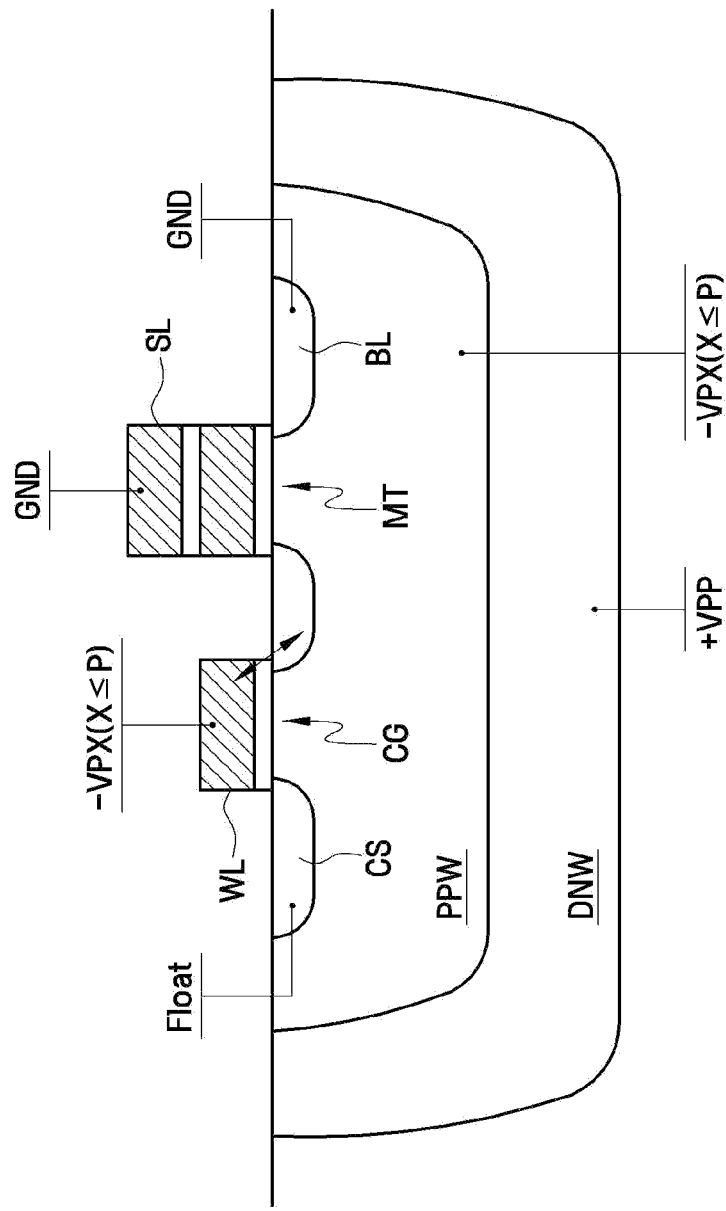
Figure 8:
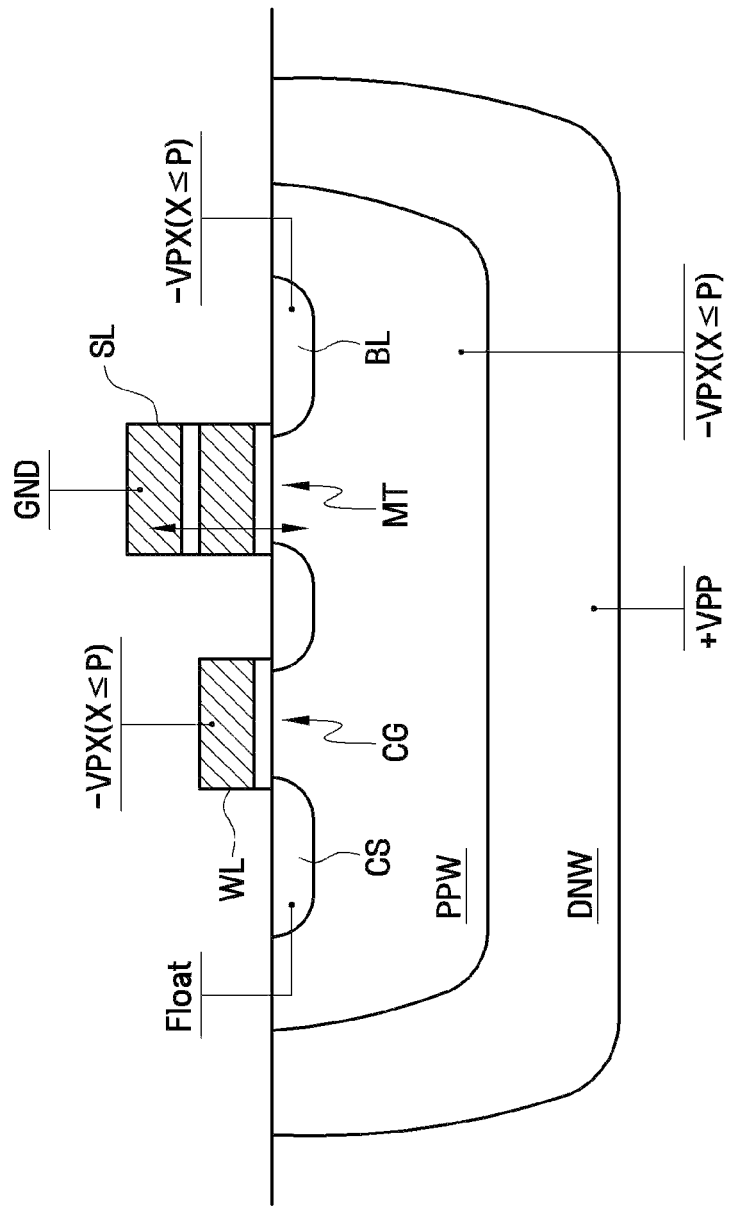

FIGS. 6 through 8 are diagrams for explaining various effects of the programming methods illustrated in FIGS. 3 through 5.

FIG. 6 is a cross sectional view of a memory cell in region A of FIG. 2. During a program operation of memory cell MC using the methods of FIGS. 3 through 5, a voltage +VPX (X≤P) is applied to selection line SL (or the global control line GCL) of the memory cells included in region A, and a voltage −VPX (X≤P) is applied to pocket well PPW. Because X is less than or equal to P, the FN tunneling effect is reduced compared to a situation where a voltage of +VPP is applied to selection line SL (or the global control line GCL) and a voltage −VPP is applied to pocket well PPW. Accordingly, it is possible to improve the disturbance characteristics of the memory cells in region A using the configuration of FIG. 6.

FIG. 7 is a cross sectional view of memory cells included in a region B of FIG. 2. During a program operation of memory cell MC using the methods of FIGS. 3 through 5, a voltage of −VPX (X≤P) is applied to wordline WL of the memory cells included in region B, a voltage of −VPX (X≤P) is applied to pocket well PPW, and a ground voltage GND is applied to bit line BL. Because X is less than or equal to P, the number of electron-hole pairs generated at a floating junction is reduced compared to a situation where a voltage −VPP is applied to wordline WL, a voltage −VPP is applied to pocket well PPW, and a ground voltage GND is applied to bit line BL. Accordingly, it is possible to improve the disturbance characteristics of memory cells in region B using the configuration of FIG. 7.

FIG. 8 is a cross sectional view of a memory cell included in a region C of FIG. 2. During a program operation of memory cell MC using the methods of FIGS. 3 through 5, a voltage −VPX (X≤P) is applied to bit lines BL, pocket well PPW and wordline WL of memory cells in region C, and ground voltage GND is applied to selection line SL (or the global control line GCL). Accordingly, similar to FIGS. 6 and 7, the FN tunneling effect is reduced compared to a situation where a voltage −VPP is applied to bit lines BL, pocket well PPW, and wordline WL, and ground voltage GND is applied to selection line SL (or the global control line GCL). Accordingly, it is possible to improve the disturbance characteristics of memory cells included in region C using the configuration of FIG. 8.

Figure 9:
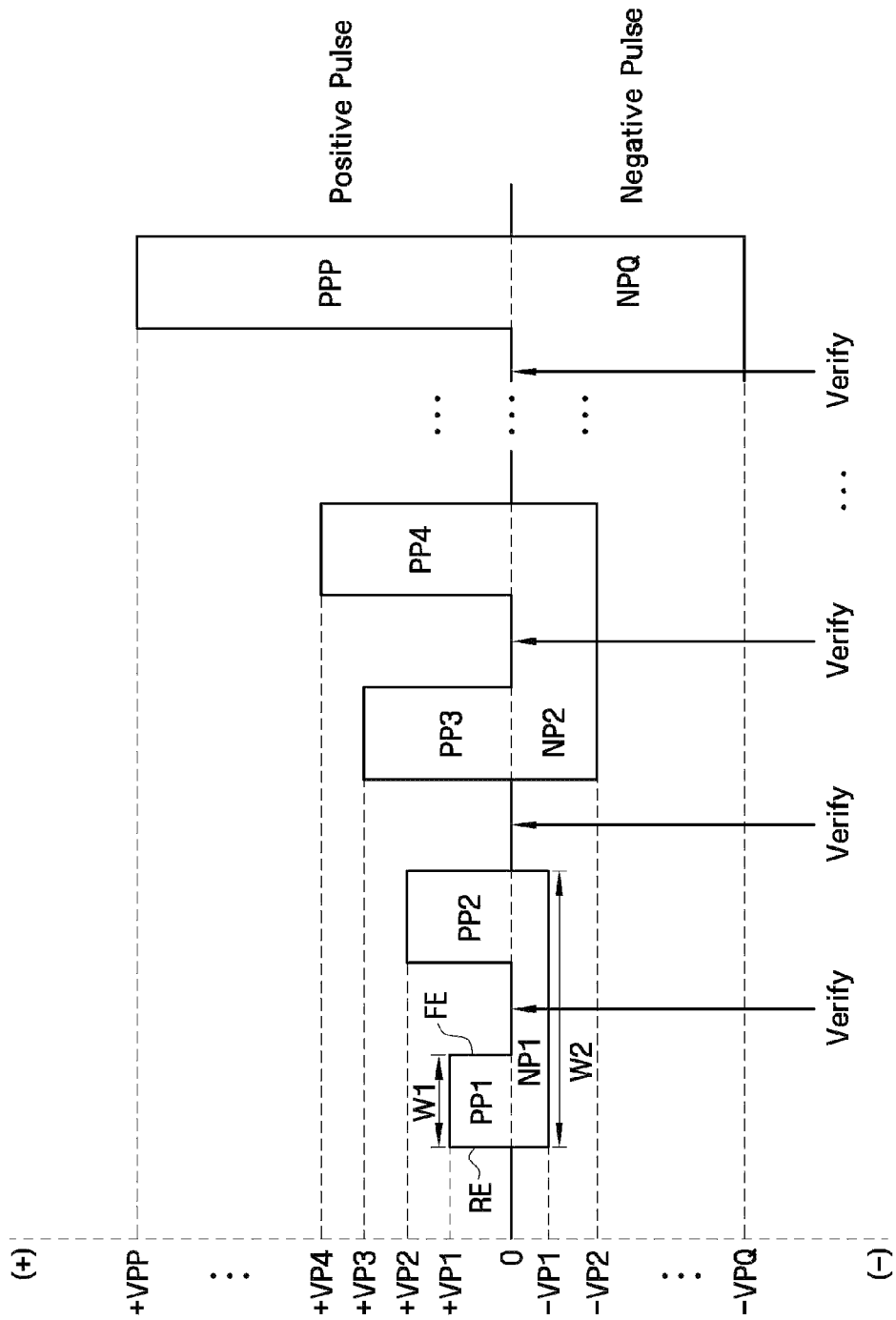
FIG. 9 is a diagram for explaining a programming method for a nonvolatile memory device in accordance with another embodiment of the inventive concept.
Figure 10:
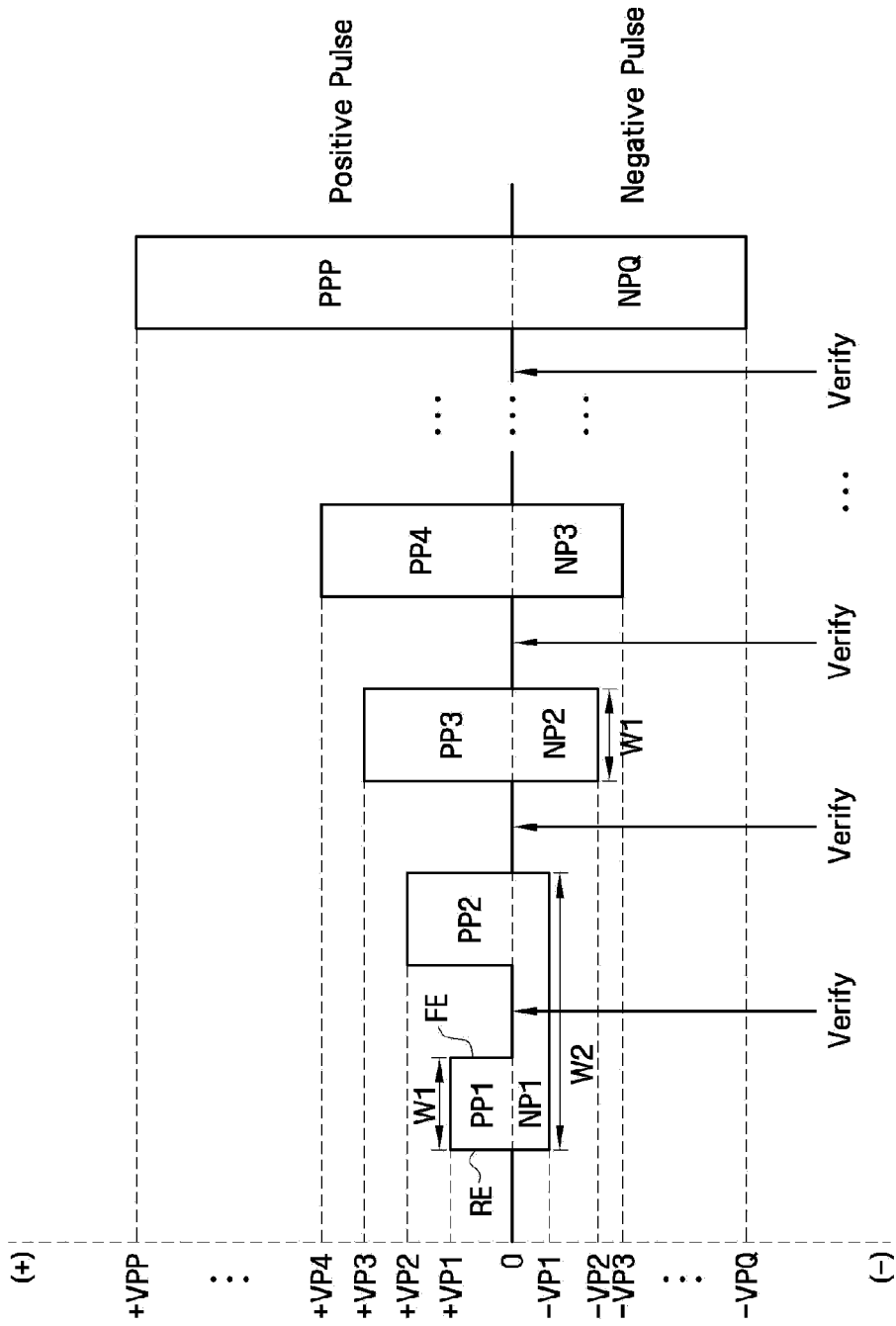
FIG. 10 is a diagram for explaining a variation of the method of FIG. 9 in accordance with an embodiment of the inventive concept.

FIG. 9 is a diagram for explaining a programming method of a nonvolatile memory device in accordance with another embodiment of the inventive concept. FIG. 10 is a diagram for explaining a variation of the method of FIG. 9. For convenience, the methods of FIGS. 9 and 10 are both explained with reference to memory cell array 10 of FIG. 2.

Referring to FIG. 9, positive step pulses PP1 through PPP have the same pulse width W1 and gradually and sequentially increasing pulse levels +VP1 through +VPP, and negative step pulses NP1 through NPQ have a pulse width W2 different from pulse width W1 and gradually and sequentially increasing pulse levels −VP1 through −VPQ.

In the method of FIG. 9, although a plurality of positive step pulses PP1 through PPP and a plurality of negative step pulses NP1 through NPQ are applied to memory cell array 10 in pairs with overlapping rising edges RE, the number of positive step pulses PP1 through PPP applied to memory cell array 10, which is less than or equal to P, can be different from the number of negative pulses applied to memory cell array 10 during the programming of the memory cell, which is less than or equal to Q. In this case, the number Q of negative step pulses NP1 through NPQ applied to memory cell array 10 during the programming of the memory cell may be smaller than the number P of positive step pulses PP1 through PPP.

In the method of FIG. 9, a first positive step pulse PP1 and a first negative step pulse NP1 are applied to memory cell array 10 such that a rising edge RE of positive step pulse PP1 overlaps a rising edge RE of first negative step pulse NP1. Using the first positive step pulse PP1 and the first negative step pulse NP1, the method then verifies whether at least one memory cell (e.g., memory cell MC) included in memory cell array 10 is normally programmed A second positive step pulse PP2 is applied to memory cell array 10 while the first negative step pulse NP1 is applied to memory cell array 10. These operations may be repeated until, e.g., memory cell MC is successfully programmed.

As described above, where pulse width W2 of negative step pulses NP1 through NPQ is larger than pulse width W1 of positive step pulses PP1 through PPP, it is possible to more stably apply a negative voltage to a wide region such as pocket well PPW. In this case, in verifying steps performed while negative step pulses NP1 through NPQ are applied to memory cell array 10, a negative voltage is applied to a substrate (e.g., pocket well PPW) on which memory cell array 10 is formed. In other words, the verifying steps can be performed while a negative voltage is applied to the substrate (e.g., pocket well PPW).

Although two positive step pulses (e.g., positive step pulses PP1 and PP2) are applied to memory cell array 10 while one negative step pulse (e.g., the negative step pulse NP1) is applied to memory cell array 10 in the embodiment of FIG. 9, the inventive concept is not limited thereto. Rather, the number of positive step pulses applied to memory cell array 10 while one negative step pulse (e.g., negative step pulse NP1) is applied to memory cell array 10 can be modified. Further, a plurality of positive step pulses PP1 through PPP and a plurality of negative step pulses NP1 through NPQ are applied to memory cell array 10 with falling edges FE overlapping each other.

Referring to FIG. 10, in a variation of the method of FIG. 9, a plurality of positive pulses and negative pulses are applied to memory cell array 10. In the method of FIG. 10, first and second positive step pulses PP1 and PP2 having a pulse width W1 and a first negative step pulse NP1 having a pulse width W2 different from pulse width W1, which form a pair of positive and negative step pulses, are applied to memory cell array 10. Thereafter, a third positive step pulse PP3 and a second negative step pulse NP2 having the same pulse width W1 are applied to memory cell array 10.

In FIG. 10, pulse width W2 of at least one negative step pulse (e.g., negative step pulse NP1) among the negative step pulses NP1 through NPQ is different from pulse width W1 of other negative step pulses NP2 through NPQ. Although the pulse width of one negative step pulse is different from the pulse width of the other negative step pulses in the example of FIG. 10, the inventive concept is not limited thereto. Rather, the number of negative step pulses having a pulse width different from that of the other negative step pulses can be modified. For instance, pulse patterns from the above described programming methods can be variously combined with each other.

As described above, when programming the memory cell MC by applying a plurality of positive pulses and a plurality of negative pulses to memory cell array 10, it is possible to improve disturbance characteristics of cells adjacent to memory cell MC. As this has been described with reference to FIGS. 6 through 8, a repeated description will be omitted in order to avoid redundancy.

Additionally, although only programming methods of a nonvolatile memory devices have been described above, the above description may be also applied to erasing methods of a nonvolatile memory device based on similar principles. For example, where an erase voltage including a plurality of positive pulses and a plurality of negative pulses is applied to memory cell array 10, it is possible to improve erase disturbance characteristics of cells adjacent to a cell to be erased. This will be apparent to those having ordinary skill in the art from the foregoing description, and thus, a detailed description thereof will be omitted.

Figure 11:
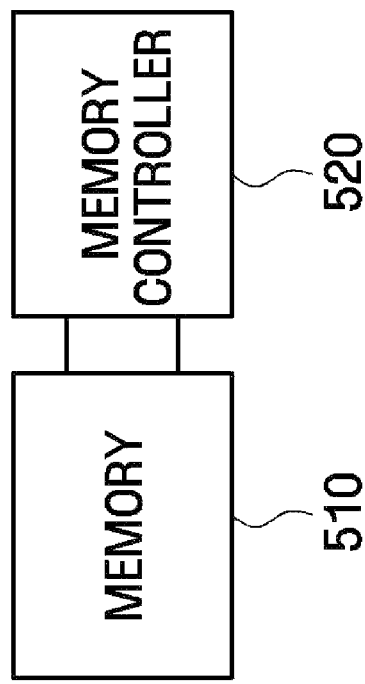
FIGS. 11 through 13 are block diagrams of nonvolatile memory systems in accordance with various embodiments of the inventive concept.
Figure 12:
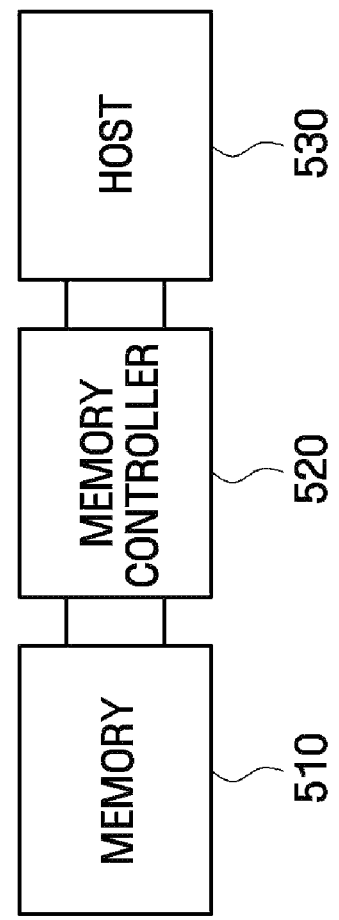
Figure 13:
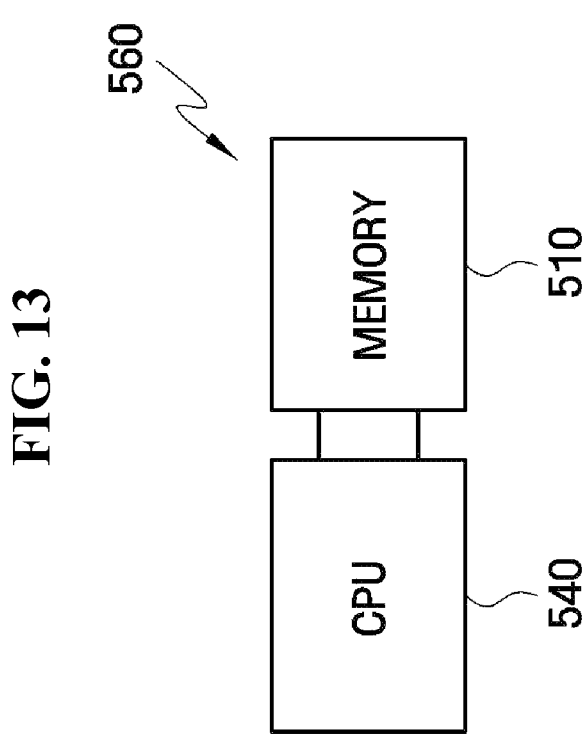

FIGS. 11 through 13 are block diagrams of nonvolatile memory systems in accordance with various embodiments of the inventive concept.

Referring to FIG. 11, a nonvolatile memory system comprises a memory 510 and a memory controller 520 connected to memory 510. Memory 510 can be a nonvolatile memory device programmed by one of the methods described above with reference to FIGS. 1-10. Accordingly, memory 510 may experience improved disturbance characteristics such as those described above.

Memory controller 520 provides input signals to memory 510 to control its operation. These signals can include, for instance, command signals and address signals for controlling read and write operations.

The system of FIG. 11 can be implemented in a card such as a memory card. In some embodiments, the system is embodied in a card satisfying industry standards and used in electronic devices such as mobile phones, two-way communication systems, one-way pagers, two-way pagers, personal communication systems, portable computers, personal data assistants (PDAs), audio and/or video players, digital and/or video cameras, navigation systems, or global positioning systems (GPS). The system can also be used in other devices, such as a memory stick.

Referring to FIG. 12, a nonvolatile memory system in accordance with another embodiment of the inventive concept comprises memory 510, memory controller 520, and a host system 530. In this example, host system 530 is connected to memory controller 520 via a bus and provides control signals to memory controller 520. Memory controller 520 then controls operations of memory 510 according to the control signals. Host system 530 can take various forms, such as a processing system used in a mobile phone, a two-way radio communication system, a one-way pager, a two-way pager, a personal communication system, a portable computer, a PDA, an audio and/or video player, a digital and/or video camera, or a navigation system, a GPS.

Although the memory controller 520 is interposed between the memory 510 and host system 530 in FIG. 12, it is not limited thereto, and memory controller 520 could be selectively omitted in a system in accordance with still other embodiments.

Referring to FIG. 13, a nonvolatile memory system in accordance with still another embodiment of the inventive concept is a computer system 560 comprising a central processing unit (CPU) 540 and a memory 510. In computer system 560, memory 510 is connected to CPU 540 directly or using a typical computer bus architecture. Memory 510 stores an operation system (OS) instruction set, a basic input/output start up (BIOS) instruction set, an advanced configuration and power interface (ACPI) instruction set and the like, or may be used as a large-capacity storage device such as a solid state disk (SSD).

For convenience of explanation, only some of the features in computer system 560 are illustrated in FIG. 13. In addition, for convenience of explanation, memory controller 520 is omitted between memory 510 and the CPU 540 in FIG. 13, but memory controller 520 can be interposed between the memory 510 and CPU 540 in other embodiments.

While the inventive concept has been particularly shown and described with reference to embodiments thereof, it will be understood by those of ordinary skill in the art that various changes in form and detail may be made to the embodiments without departing from the scope of the inventive concept as defined by the following claims. Accordingly, the embodiments should be considered in a descriptive sense only and not for purposes of limitation.

What is claimed is:

1. A programming method for a nonvolatile memory device comprising a memory cell array in which at least one memory cell comprises a memory transistor connected to a selection line and a control gate connected to a wordline, the method comprising:
   simultaneously applying a plurality of positive pulses and a plurality of negative pulses to the memory cell,
   wherein simultaneously applying positive pulses and negative pulses to the memory cell comprises applying the positive pulses and the negative pulses to the memory cell array such that a rising edge of at least one of the positive pulses overlaps a rising edge of at least one of the negative pulses, and
   wherein the positive pulses are positive step pulses having gradually increasing pulse levels, and the negative pulses are negative step pulses having gradually increasing pulse levels.

2. The programming method of claim 1, wherein, in a program operation of the at least one memory cell, a number of the positive step pulses is equal to a number of the negative step pulses.

3. The programming method of claim 2, wherein the positive step pulses and the negative step pulses are applied to the memory cell array in pairs, each pair including one of the positive step pulses and one of the negative step pulses and having overlapping rising edges.

4. The programming method of claim 1, wherein, in a program operation of the at least one memory cell, a number of the positive step pulses applied to the memory cell array is different from a number of the negative step pulses applied to the memory cell array.

5. The programming method of claim 4, wherein the number of the negative step pulses is smaller than the number of the positive step pulses.

6. The programming method of claim 1, wherein a pulse width of the positive step pulses is substantially equal to a pulse width of the negative step pulses.

7. The programming method of claim 1, wherein a pulse width of at least one of the negative step pulses is different from a pulse width of the other ones of the negative step pulses.

8. The programming method of claim 1, wherein simultaneously applying positive pulses and negative pulses to the memory cell comprises applying the positive pulses to the selection line and the negative pulses to the wordline.

9. The programming method of claim 1, wherein the memory cell array is a two-transistor (2T)-Fowler-Nordheim (FN)-NOR memory cell array.

10. A programming method for a nonvolatile memory device comprising a memory cell array in which at least one memory cell comprises a memory transistor connected to a selection line and a control gate connected to a wordline, the method comprising:
    simultaneously applying a plurality of positive pulses and a plurality of negative pulses to the memory cell,
    wherein simultaneously applying positive pulses and negative pulses to the memory cell comprises applying the positive pulses and the negative pulses to the memory cell array such that a rising edge of at least one of the positive pulses overlaps a rising edge of at least one of the negative pulses, and
    wherein the positive pulses include positive step pulses having the same pulse level, and the negative pulses include negative step pulses having the same pulse level.

11. The programming method of claim 10, wherein the magnitude of the positive step pulses is different from the magnitude of the negative step pulses.

12. A programming method of a nonvolatile memory device comprising a memory cell array in which at least one memory cell comprises a memory transistor connected to a selection line and a control gate connected to a wordline, the method comprising:
    (a) applying a first positive step pulse to the selection line and a first negative step pulse to the wordline such that a rising edge of the first positive step pulse overlaps a rising edge of the first negative step pulse;
    (b) verifying, using the first positive step pulse and the first negative step pulse, whether the at least one memory cell is successfully programmed; and
    (c) applying a second positive step pulse to the selection line while the first negative step pulse is applied to the word line.

13. The programming method of claim 12, further comprising repeating (a)-(c) until the at least one memory cell is successfully programmed.

14. The programming method of claim 13, wherein the at least one memory cell is formed on a substrate, and a negative voltage is applied to the substrate during (b).

15. The programming method of claim 12, further comprising:
    applying a third positive step pulse to the selection line and a second negative step pulse having the same pulse width to the wordline such that a rising edge of the third positive step pulse overlaps a rising edge of the second negative step pulse and a falling edge of the third positive step pulse overlaps a falling edge of the second negative step pulse.

16. The programming method of claim 12, wherein the at least one memory cell is programmed and erased by Fowler-Nordheim (FN) tunneling.

17. The programming method of claim 12, wherein the memory cell array is a two-transistor (2T)-Fowler-Nordheim (FN)-NOR memory cell array.

18. A method of programming a nonvolatile memory device comprising a two-transistor (2T)-Fowler-Nordheim (FN)-NOR memory cell array in which a selected memory cell comprises a memory transistor connected to a selection line, and a control gate connected to a wordline, the method comprising:
    applying positive step pulses having gradually increasing pulse levels to the selection line and applying negative step pulses having gradually increasing pulse levels to the wordline to program the selected memory cell, wherein each of the positive step pulses overlaps in time with a corresponding one of the negative step pulses.

* * * * *